(12) United States Patent
Street et al.

(10) Patent No.: US 7,897,439 B2
(45) Date of Patent: Mar. 1, 2011

(54) ELECTRONIC DEVICE WITH UNIQUE ENCODING

(75) Inventors: Robert A. Street, Palo Alto, CA (US); Ana Claudia Arias, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/645,987

(22) Filed: Dec. 23, 2009

(65) Prior Publication Data

US 2010/0099220 A1    Apr. 22, 2010

Related U.S. Application Data

(62) Division of application No. 11/313,498, filed on Dec. 21, 2005.

(51) Int. Cl.
*H01L 21/82* (2006.01)

(52) U.S. Cl. ............ 438/130; 438/158; 257/E21.414

(58) Field of Classification Search .......... 438/130
See application file for complete search history.

(56) References Cited

U.S. PATENT DOCUMENTS

| 6,723,576 | B2 * | 4/2004 | Nozawa et al. ........ 438/30 |
| 2001/0039124 | A1 | 11/2001 | Shimoda | |
| 2003/0030074 | A1 | 2/2003 | Walker et al. | |
| 2005/0133790 | A1 | 6/2005 | Kato | |
| 2005/0146006 | A1 | 7/2005 | Yamazaki et al. | |

OTHER PUBLICATIONS

Arias, "All jet-printed polymer thin-film transitor active-matrix backplanes", Oct. 2004, Applied Physics Letters, pp. 3304-3306.*
European Search Report, Feb. 25, 2010.
Wong, W. S., et al., "Jet-printed fabrication of a -s1:h thin-film transistors and arrays", Journal of Non-Crystalline Solids, North-Holland Physics Publishing, Amsterdam, NL, vol. 299-302, Apr. 1, 2002, pp. 1335-1339.
Paul, Kateri E., et al. "Additive jet printing of polymer thin-film transistors", Applied Physics Letters, AIP, American Institute of Physics, Melville, NY, U.S. vol. 83, n. 10, Sep. 8, 2003, pp. 2070-2072.

* cited by examiner

*Primary Examiner*—Chandra Chaudhari
(74) *Attorney, Agent, or Firm*—Fay Sharpe LLP

(57) ABSTRACT

An electronic device comprising a thin film transistor (TFT) array and manufacturing methods thereof according to various embodiments. Jet-printed material is deposited on selected partially formed transistors to form completed transistors. Thus, a selected number of the TFTs are connected into the circuit while the remainder of the TFTs are not connected. An electronic read-out of the array identifies the specific array by distinguishing the connected TFTs from the unconnected ones. For a TFT array with n elements there are $2^n$ alternative configurations; therefore, a relatively small number of TFTs can uniquely identify a huge number of devices. Such uniquely encoded devices have applications for encryption, identification and personalization of electronic systems.

24 Claims, 5 Drawing Sheets

ELECTRONIC DEVICE WITH UNIQUE ENCODING

This application is a divisional application of application Ser. No. 11/313,498, filed Dec. 21, 2005.

BACKGROUND

The exemplary embodiment relates to a semiconductor apparatus and a method for producing it and, more particularly, to a semiconductor apparatus having a thin film transistor (TFT) matrix panel with electronic encryption and a method for producing it.

A thin film transistor (TFT) is special kind of field effect transistor (FET) made by depositing thin films for the metallic contacts, semiconductor active layer, and dielectric layer. Most TFTs are not transparent themselves, but their electrodes and interconnects can be.

Although the major application of TFT technology is currently in LCDs, there are many other microelectronic products that could benefit from this technology. For example, the large-area X-ray imager has been successfully fabricated by integrating amorphous silicon (a-Si:H) TFTs with p-i-n photodiodes over a glass substrate coated with an X-ray converter material. In addition, p-channel TFTs have been used to replace high-resistance loads in static random access memory (SRAM) devices. In another example, high-density and high-response-speed printer and fax machines fabricated with TFTs have also been demonstrated. By varying the gate-metal material and the operation condition, the TFT can be used as a chemical sensor, e.g., to detect changes in gas-phase hydrogen concentration or liquid-phase potassium concentration.

In addition, as described more fully below, a TFT array may be used as an electronic device that can be built directly on a silicon IC or a printed circuit board and fabricated in such a way that each device has a unique encoding built into its physical structure.

BRIEF DESCRIPTION

Disclosed herein is an electronic device comprising a semiconductor device such as a thin film transistor (TFT) array and manufacturing methods thereof according to various embodiments. Generally, a selected number of the TFTs are connected into the circuit while the remainder of the TFTs are not connected. An electronic read-out of the array identifies the specific array by distinguishing the connected TFTs from the unconnected ones. For a TFT array with n elements there are $2^n$ alternative configurations; therefore, a relatively small number of TFTs can uniquely identify a huge number of devices. Such uniquely encoded devices have applications for encryption, identification and personalization of electronic systems.

One step in the construction of the TFT array is to print a material selectively onto specific TFTs. Normal semiconductor processing using photolithography would require a different mask for each device, and changing the mask for each device is not practical. Jet-printing offers a drop-on-demand printing system that can print a different pattern for each device, since the printer does not require a physical mask. The choice of the printed pattern is created in software.

In one embodiment, an electronic device comprises a plurality of partially formed thin film transistors, each of the transistors including some of a gate contact, a source contact, a drain contact and a semiconductor, jet-printed material deposited on selected partially formed transistors to form completed transistors, and readout electronics to detect signals from the transistors and create an encoded bit stream, wherein the completed transistors and the partially formed transistors define the encoded bit stream.

In another embodiment, an electronic device comprises a printed circuit board having a plurality of external leads, a jet-printed metal layer to connect selected leads to a voltage source, and an electronic circuit to measure the voltage on the external leads to identify the printed circuit board.

DETAILED DESCRIPTION

Figure 1:
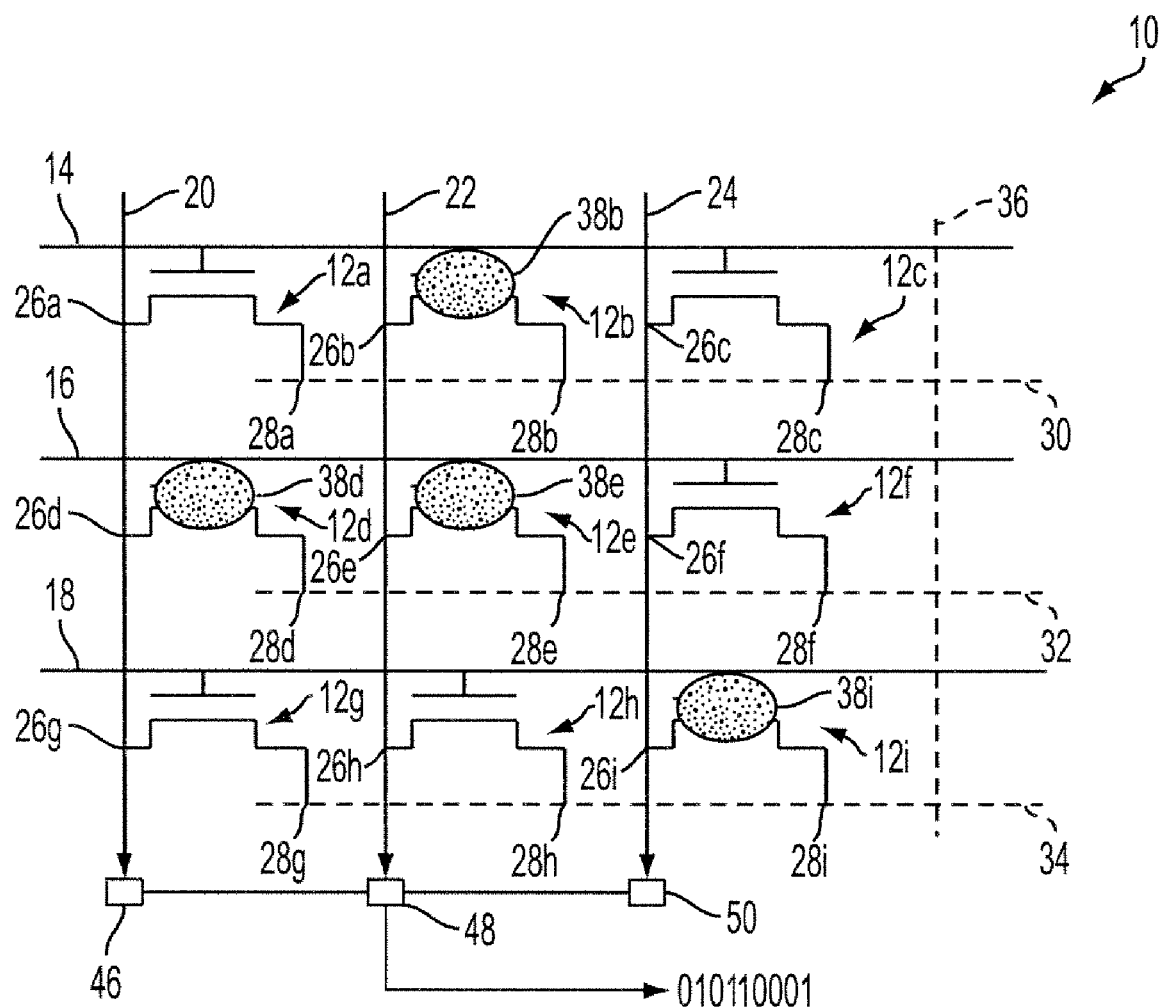
FIG. 1 is a schematic diagram of a two-dimensional matrix address array of thin film transistors wherein a subset of thin film transistors are selectively provided with a polymer semiconducting layer by ink-jet printing.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
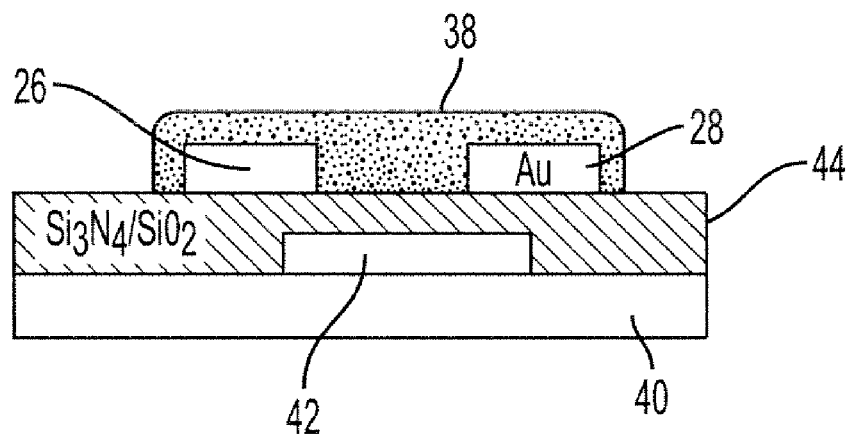
FIG. 2 is a schematic cross-section of the thin film transistor structure used to make printed polymer thin film transistor arrays.

Now, a printed device with unique encoding comprising a thin film transistor (TFT) array and manufacturing methods thereof according to various embodiments will be described with reference to the accompanying drawings. The printed encryption device will be described in detail with reference to FIGS. 1 and 2. FIG. 1 is a schematic equivalent circuit diagram of a TFT array panel 10 according to an exemplary embodiment, and FIG. 2 is a cross-sectional view of a thin film transistor 12 from the TFT array panel 10. The TFT array 10 comprises an n×m array of thin film field effect transistors 12a-12i, in which a subset of TFTs (e.g., 12b, 12d, 12e, and 12i) are selectively provided with a polymer semiconducting layer by ink-jet printing. Only the printed TFTs (e.g., 12b, 12d, 12e, and 12i) will turn on when a gate voltage is applied and the non-printed devices (i.e., 12a, 12c, 12f, 12g, and 12h) are permanently turned off. The printed pattern provides the encoding and the pattern is electronically read out to validate the device by activating the matrix addressing. Every device that is to be secured can be made with a different printed pattern.

Any number of TFTs can be used for the encoding, depending on the requirement of the application, and a typical num ber is in the range 10 to 1000. It is convenient to organize the TFTs into a matrix because the number of contacts is reduced. An n×m array requires only about n+m contacts.

Each of the gate lines 14, 16, and 18 for transmitting gate signals extends substantially in a transverse direction. The gate lines are preferably made of Al containing metal such as Al and Al alloy, Cu containing metal such as Cu and Cu alloy, Cr, Mo, Mo alloy, Ta, or Ti. They may have a multi-layered structure including two films having different physical characteristics. One of the two films is preferably made of low resistivity metal including Al containing metal for reducing signal delay or voltage drop in the gate lines. The other film is preferably made of material such as Cr, Mo and Mo alloy, Ta or Ti, which has good physical, chemical, and electrical contact characteristics. Good examples of the combination of the two films are a lower Cr film and an upper Al—Nd alloy film and a lower Al film and an upper Mo film. The gate lines may have a triple-layered structure including a lower Mo film, an intermediate Al film, and an upper Mo film.

A plurality of data lines 20, 22, and 24 are formed on the gate insulating layer and connect to one of the TFT contacts 26 or 28. The data lines 20, 22, and 24 for transmitting data voltages extend substantially in the longitudinal direction and intersect the gate lines. The data lines 20, 22, and 24 are preferably made of a low resistivity metal. The TFT contacts 26 and 28 must be a metal that forms a suitable ohmic contact to the TFT. For a polymer TFT, good contact materials include Au, Ag, ITO and organic conductors. The TFT contacts 26 and 28 and the data lines 20, 22, and 24 can be comprised of the same metal or could comprise different metals in contact As shown in FIG. 1, there are three bias lines 30, 32, and 34 and a common bias 36. Thus, as shown in FIG. 1, a common bias connection is made to the other TFT contact, and the metal requirements are the same as for the data lines 20, 22, and 24. One specific organization of the gate, data and bias lines is shown in FIG. 1, but alternative arrangements are possible. For example, the bias lines 30, 32, and 34 could be parallel to the data lines 20, 22, and 24 rather than to the gate lines 14, 16, and 18.

As noted earlier, some of the TFTs 12 include a jet-printed semiconductor layer 38. Generally, polymers or soluble organic small molecules offer the best choice for a solution-based semiconductor layer, and they can be jet-printed effectively. Jet-printing of polymer TFTs in the structure shown in FIG. 1 is described in, for example, A. Arias, S. E. Ready, R. Lujan, W. S. Wong, K. E. Paul, A. Salleo, R. Apte, Y. Wu, P. Liu, B. Ong and R. A. Street, *"Jet-printed polymer thin film transistor display backplanes"*, Applied Physics Letters, 85, 3304 (2004). Encapsulation of the polymer may be employed to extend the life of the TFT. Multi-ejector print-heads are available that will print the required pattern quickly and reliably. Only the final deposition of the polymer must be performed by jet-printing so that each device can be made with a unique encoded pattern. The other layers of the FET (gate metal, dielectric and source-drain metal) are common to all devices of the same design. While these layers may be patterned by printing, this is not required and other methods, such as conventional photolithography, could be used instead.

It is well known that the fabrication of large-area arrays arises from the photolithographic process used to pattern the array. In order to avoid such photolithographic processes, direct marking techniques have been developed as an alternative to photolithography. Examples of direct marking techniques used in place of photolithography include utilizing a xerographic process to deposit a toner that acts as an etch mask and using an ink-jet printhead to deposit a liquid mask. Both techniques have corresponding problems. Toner-based materials are hard to control and difficult to remove after deposition. The use of ink-jetted liquids to directly write etch masks is a practical alternative to printed toner although jet printing also possesses inherent complexities.

Special piezoelectric ink-jet printheads allow generation of low droplet volumes. Small printed features have been obtained using ink-jet printheads as described in, for example, U.S. Pat. No. 6,972,261, issued to Wong et al., entitled "METHOD FOR FABRICATING FINE FEATURES BY JET-PRINTING AND SURFACE TREATMENT" and incorporated by reference herein. In the described reference, wax etch masks patterned by ink-jet printing are used to produce fine-feature devices on a substrate. The system creates a pattern, typically using a printer to controllably eject individual droplets to form a patterned protective layer or coating over regions of the substrate to define the outline of a feature. Regions that were not at one time covered by protective layer will be subject to deposition (or removal) of materials used to form various features.

The TFT shown in FIG. 2 is a bottom gate device typical of the structure that is commonly used for TFT. However a top gate device could also be used. The TFT comprises an insulating substrate 40, a metal gate contact 42, an insulating gate dielectric 44, the semiconductor layer 38, and the metal source and drain contacts 26 and 28 (referred to as the TFT contacts). In the bottom gate design of FIG. 2, any number of gate lines may be formed on the insulating substrate 40. A gate insulating layer preferably made of silicon nitride ($SiN_x$) or silicon oxide may be formed on the gate lines. The metal source and drain contacts 26 and 28 are applied before the semiconductor 38, in what is known as a coplanar configuration. An alternative configuration known as the staggered configuration has the source and drain deposited after the semiconductor. Any of these TFT configurations will perform adequately, but the bottom gate coplanar configuration is preferred for jet printing the polymer semiconductor 38.

The electronic device with unique encoding operates like a conventional active matrix addressed array. That is, a gate pulse of appropriate voltage, which for the polymer TFT would be a negative voltage typically in the range −10 to −30 V, is applied to address each row of TFTs in turn, while the other rows are held in the off-state at typically +5 to +20V. Those TFTs with a printed semiconductor layer 38 (i.e., TFTs 12b, 12d, 12e, and 12i) will respond by forming a conducting link between the data line (20, 22 or 24) and the common bias line 36, while the non-printed TFTs (i.e., 12a, 12c, 12f, 12g, and 12h) remain in a high resistance state. After the first line of TFTs is read, the gate voltage is turned off and the subsequent gate lines are turned on in sequence. The result is a unique output bit stream of the encoded device, which matches the specific pattern of printed TFTs. A "1" in the bit stream corresponds to a printed TFT, while a "0" in the bit stream corresponds to a non-printed TFT. Thus, in the example shown in FIG. 1, the encoded output bit stream is 010110001.

The signals from the TFTs are detected by readout electronics 46, 48 and 50, which comprise circuitry outside of the TFT array 10, either integrated next to the TFT array or external to the TFT array 10 (e.g., in a silicon IC). The purpose of the readout electronics 46, 48 and 50 is to provide the encoded output of the TFT array 10 to the electronic system, which will use the information. Hence, the details of the readout electronics 46, 48 and 50 will depend on the specific needs of the electronic system. The readout electronics 46, 48 and 50 will typically contain a sense amplifier, which amplifies the output of the TFT array 10 and creates the encoded bit stream that is used by the electronic system. The signal is binary so that the readout electronics 46, 48 and 50 minimally require a discriminator to identify the state of the corresponding bit. The sense amplifier could be by voltage sensing, charge sensing or current sensing, as is conventionally used to amplify small signals. The readout electronics 46, 48 and 50 also provide the signals to apply gate voltage pulses in sequence.

Figure 3:
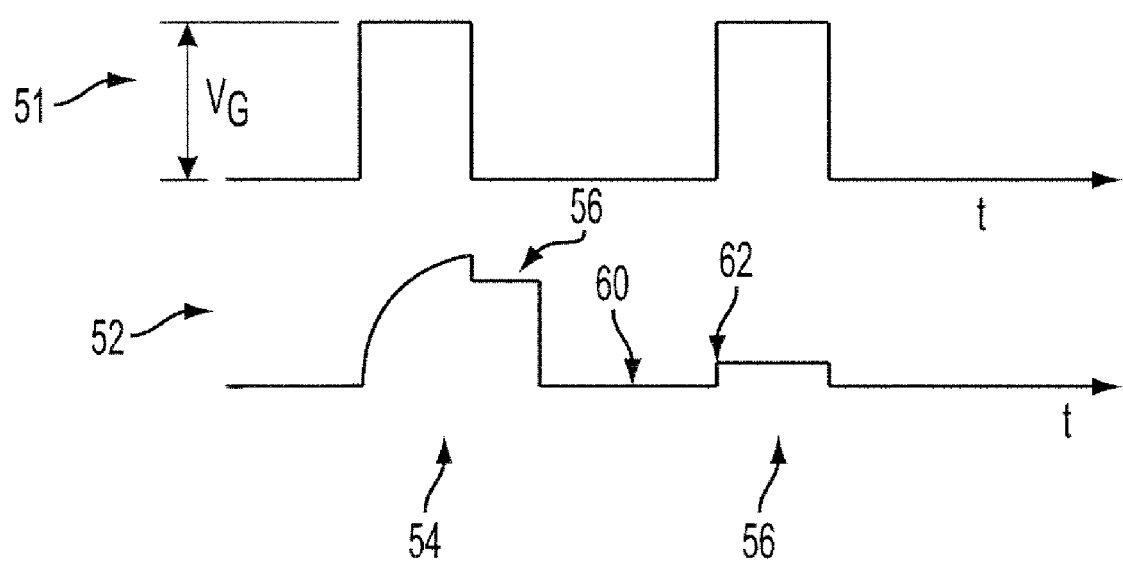
FIG. 3 shows the pulse signal provided to the gates of the TFT array and the corresponding response for a printed thin film transistor and a non-printed thin film transistor.

An illustration of how the signal develops and is sensed after the gate pulse is applied is shown in FIG. 3, which compares the results from TFTs with and without the printed semiconductor 38. The first curve 51 shows the gate voltage ($V_G$) versus time, while the second curve 52 below it shows the corresponding charge or voltage portion 54 and 56 for a printed TFT and a not-printed TFT, respectively. When a gate pulse is applied to the first row of TFTs (e.g., 12a, 12b and 12c) any printed TFTs in that row (e.g., 12b) become conducting. A current flows from the bias line 30 to the data line 24 until the two are at the same voltage. When the gate is turned off, there will be a high voltage on the data lines corresponding to the printed TFTs and the voltage will be sensed (58). Following a reset (60), there will be a low voltage on the data lines corresponding to the non-printed TFTs. The low voltage will not be exactly zero because of leakage currents and capacitance transients (62) in the circuit, nor will the high voltage exactly equal the bias line voltage, for the same reasons. However, so long as there is a sufficient difference between the high and low voltage, the readout electronics, including a voltage sensing amplifier, can discriminate between the "1" and the "0" encoding. If a capacitor is connected to the data line, then it will store a charge which is the product of the capacitance and the data line voltage. The readout electronics 46, 48, and 50 can be configured with a charge sensing readout amplifier, which will detect the high or low amount of charge as the "1" and "0" encoding.

The fundamental speed of the TFT is given by $L^2/\mu V_G$, where L is the TFT length, $\mu$ is the mobility and $V_G$ is the gate voltage. Present jet-printing spatial resolution allows a channel length of about 20 μm and, therefore, a minimum gate pulse of 10-20 μs. Thus, a 1000-bit encoded array can be read out in less that 1 ms. If the TFT array is made by conventional photolithography, except for the final step of jet-printing the polymer, then smaller feature sizes are possible as well as faster operation.

There are a number of approaches that may be used to contact the gate and sense lines to the silicon IC, including Tape Automated Bonding (TAB) or wirebond. TAB refers to metal conductors mounted to Mylar tape, bonded to gold bumps on die. The Mylar tape is held on reels and TAB bonded die may be automatically placed onto PC boards very efficiently. Wirebond refers to the process where tiny wires are connected from chip bond pads to the leadframe. Alternatively, a shift register (a high-speed circuit that holds some number of bits for the purpose of shifting them left or right) and output multiplexer could be made from the polymer materials. The multiplexer reduces the number of interconnects by selecting gate or data lines in the TFT array with additional TFTs When a multiplexer is used, the read time would be longer but the interconnections would be considerably simpler. Even limited multiplexing provides an attractive simplification of the electronics.

Jet-printing is the preferred technique to form the unique encoding device, because the desired pattern is formed without the use of a physical mask and can be defined by software instructions to the printer. Jet-printing refers to any technique to deposit a printed pattern with single or multiple nozzles and includes the piezo-electric or thermal ejection techniques that are well known in printing technology.

An alternative embodiment of the electronic device with unique encoding uses amorphous silicon or poly-silicon for the TFT semiconductor, as in a conventional TFT array, and uses the jet-printer to print an etch mask to pattern the a-Si or p-Si layer. In locations where the mask is not printed, the etching process will remove the semiconductor layer and therefore only the printed subset of TFTs will turn on.

Amorphous silicon (a-Si) is the non-crystalline allotropic form of silicon. One of the main advantages of amorphous silicon over crystalline silicon is that it can be easily deposited over large areas and on many different substrates. Thus, amorphous silicon is used as the active layer in thin-film transistors (TFTs) which are most widely used in large-area electronics applications, mainly for liquid-crystal displays (LCDs).

Polycrystalline silicon or polysilicon or poly-Si is a material consisting of multiple small silicon crystals, and has long been used as the conducting gate material in MOSFET and CMOS processing technologies. For these technologies it is deposited using LPCVD reactors at high temperatures and is usually heavily n or p-doped.

Intrinsic and doped polysilicon has been used in large-area electronics as the active and/or doped layers in thin-film transistors. Although it can be deposited by low-pressure chemical-vapor deposition (LPCVD), plasma-enhanced chemical vapor deposition (PECVD), or solid-phase crystallization (SPC) of amorphous silicon in certain processing regimes, these processes still require relatively high temperatures of at least 300° C. These temperatures make deposition of polysilicon possible for glass substrates, but not for plastic substrates. Instead, a relatively new technique called laser crystallization can be used to crystallize a precursor amorphous silicon (a-Si) material on a plastic substrate without melting or damaging the plastic. Short, high-intensity ultraviolet laser pulses are used to heat the deposited a-Si material to above the melting point of silicon, without melting the entire substrate. The molten silicon will then crystallize as it cools. By precisely controlling the temperature gradients, researchers have been able to grow very large grains, of up to hundreds of micrometers in size in the extreme case, although grain sizes of 10 nanometers to 1 micrometer are also common. In order to create devices on polysilicon over large-areas, however, a crystal grain size smaller than the device feature size is needed for homogeneity of the devices.

One advantage of polysilicon over a-Si is that the mobility can be orders of magnitude larger and the material also shows greater stability under electric field and light-induced stress. This allows more complex, high-speed circuitry to be created on the glass substrate along with the a-Si devices, which are still needed for their low-leakage characteristics. When polysilicon and a-Si devices are used in the same process this is called hybrid processing. A complete polysilicon active layer process is also used in some cases where a small pixel size is required, such as in projection displays.

Thus, since a-Si and p-Si have higher mobility than most polymers, this would result in a faster circuit than the printed polymers, at the expense of a few additional processing steps.

Figure 4:
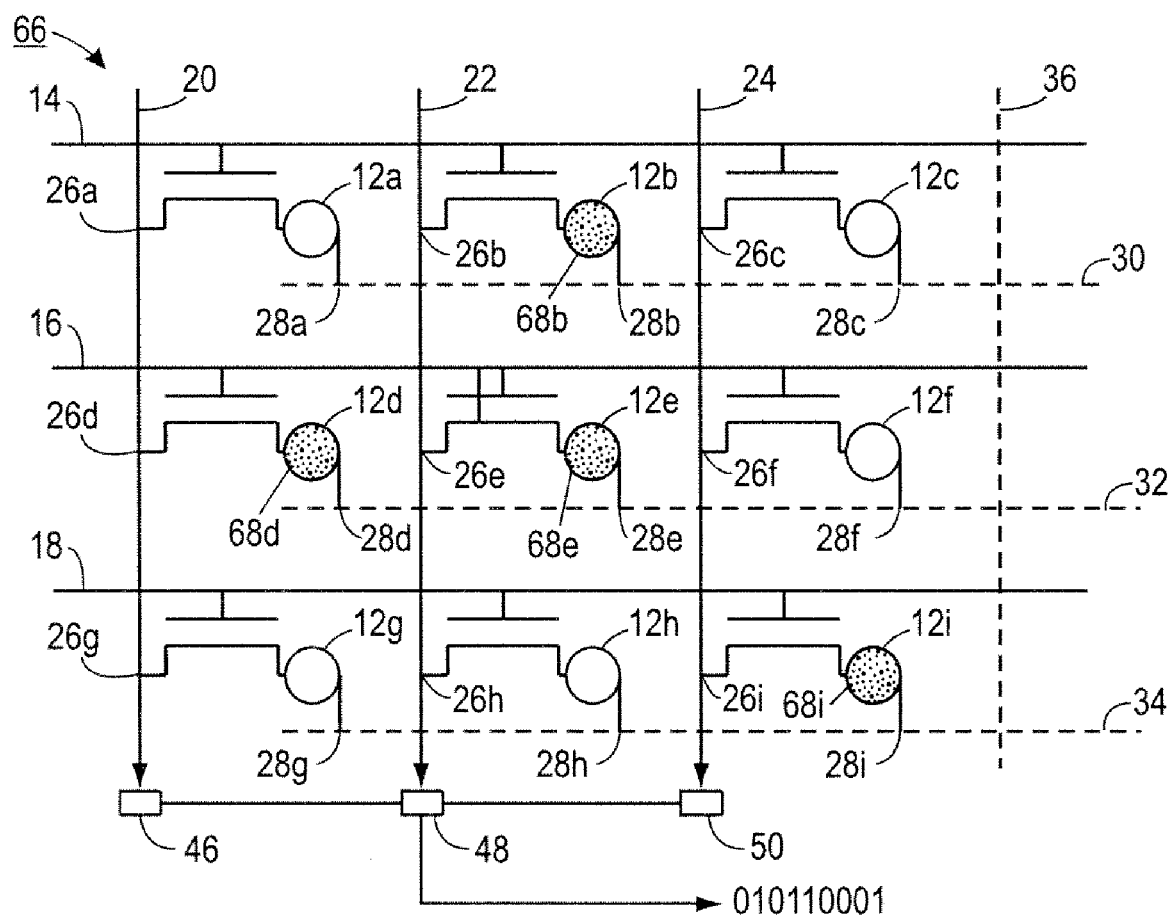
FIG. 4 is a schematic diagram of an alternative two-dimensional matrix address array of thin film transistors using printed etch masks.

FIG. 4 shows an alternative TFT array 66 wherein elements shared with the first embodiment are denoted by like reference numerals. In this alternative embodiment, the TFTs that will remain connected can be selected by printing an etch mask (e.g., 68b, 68d, 68e, and 68i) in selected locations. The location selected is one of the source-drain contacts (26 or 28) to the TFT rather than the gate contact, but the gate contact could be patterned in the same way. One way to pattern the device is to use conventional photolithography to define the etch mask for the entire source-drain metal layer, except for a chosen area of the contact region that has a customized pattern. This region is then jet-printed with an etch mask to select the TFTs that will operate, as shown in FIG. 4. The metal layer is then etched, and the resist is stripped in the usual manner.

All the other processing steps can be performed with conventional photolithographic masks, using identical masks for all devices. Only one step needs to be printed to select the devices to be etched. For amorphous silicon the gate pulse range is +10 to +30V, but otherwise the operation is the same. The encoded output bit stream (e.g., 010110001) may be determined by the readout electronics 46, 48, and 50 as described above.

Figure 5:
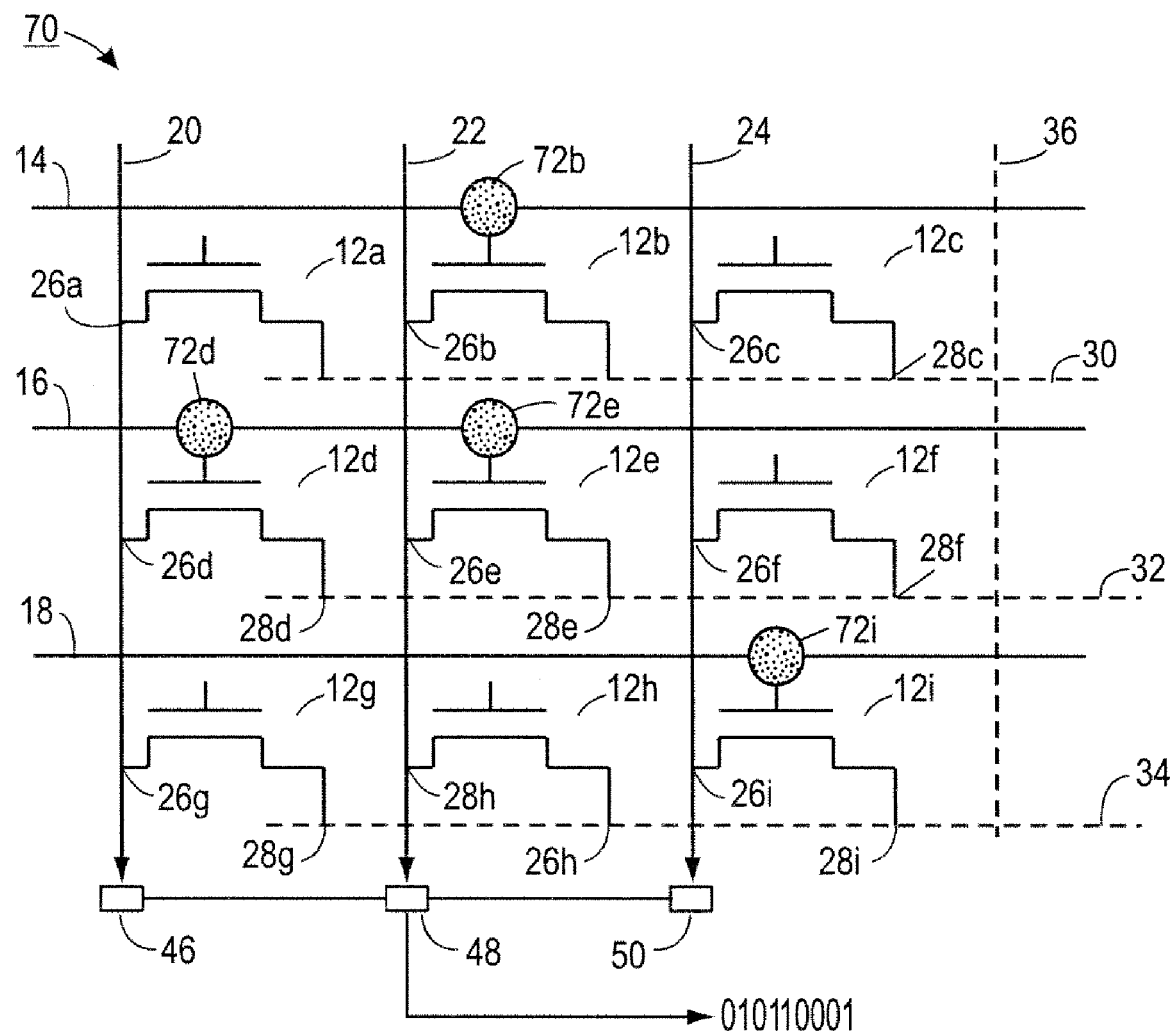
FIG. 5 is a schematic diagram of an alternative two-dimensional matrix address array of thin film transistors wherein a jet-printed connection is used to determine whether the thin film transistor is connected to the addressing circuit.

Referring now to FIG. 5, another alternative TFT array 70 incorporates printed metal bridges. Again, elements shared with the first embodiment are denoted by like reference numerals. In this embodiment, a metal connection (e.g., 72*b*, 72*d*, 72*e*, and 72*i*) is jet-printed on certain TFTs (e.g., 12*b*, 12*d*, 12*e*, and 12*i*). The metal connection determines whether or not the TFT is connected to the gate pulses that come from the readout electronic circuitry. FIG. 5 illustrates this approach for the case where the printed bridge is the connection to the TFT gate electrode. It is also possible to print the bridge at the source or drain contact (26 or 28). The gate metal could be patterned by conventional lithography, leaving a gap between the address line and the gate electrode. The gap is selectively bridged by jet-printing. Alternatively, the complete gate metal layer could be jet-printed in the desired pattern. Again, a gate pulse is applied and the output bit stream (e.g., 010110001) may be determined by the readout electronics 46, 48, and 50 as described above.

There are several known materials suitable for jet-printing conductors, including conducting polymers (PEDOT), metals (e.g. nanoparticle gold or other metal particles in suspension), or a suspension of carbon nanotubes.

There are a number of alternative circuit designs for the TFT array. For example, the TFT array could include a compensation line, which is an additional row of TFTs without the semiconductor. This compensation line would provide a signal to the sense amplifiers corresponding to response of the parasitic capacitance, which can then be directly corrected for improving the sensitivity.

The format of the TFT array can be chosen to optimize some aspect of the performance. For example, an array with an equal number of gate and sense lines minimizes the number of electrical contacts. Alternatively, the readout speed can be enhanced by providing fewer gate line and more sense lines, which would provide a faster response.

The electronic encryption devices described above can be built directly on a silicon integrated circuit and fabricated in such a way that each device has a unique encoding built into its physical structure.

The same patterning techniques that are described above can be used to customize other types of electronic circuits, such as a printed circuit board (PCB). Generally, the PCB only contains metal interconnects rather than active devices such as transistors, but the methods described above for patterning with a printed etch mask or printed metals will allow a PCB to be customized.

Figure 6:
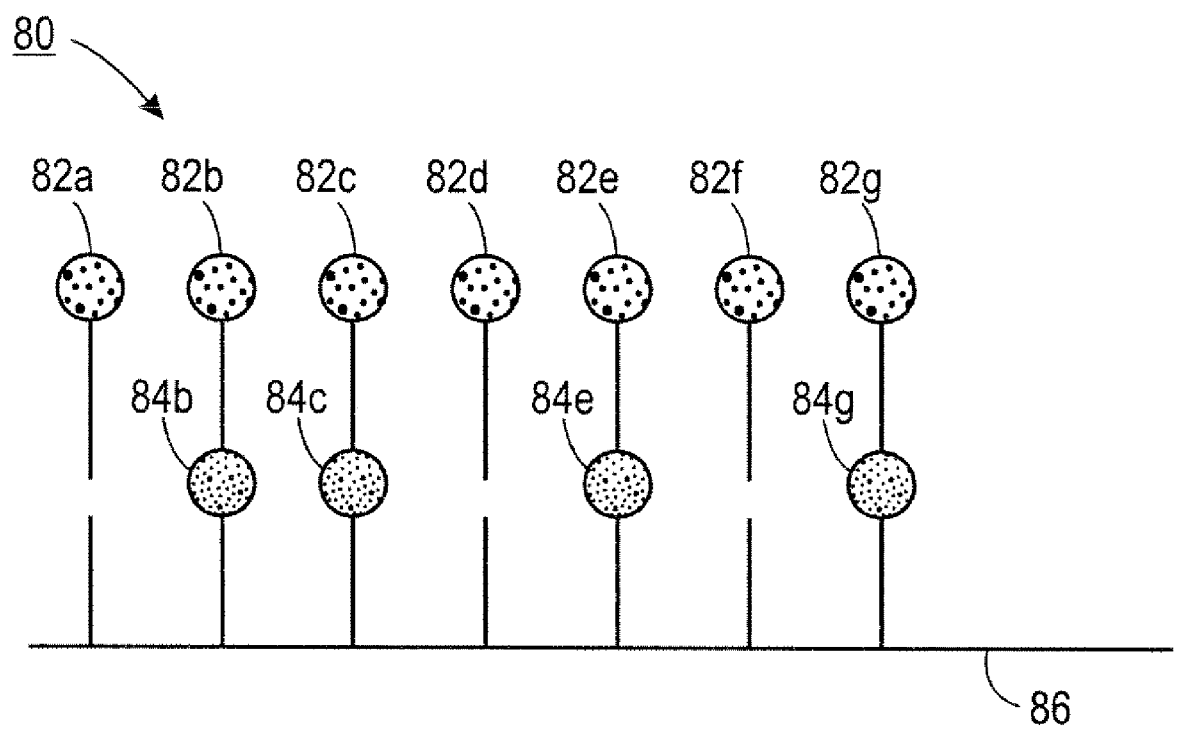
FIG. 6 is a diagram of a unique ID for a printed circuit board.

Referring now to FIG. 6, there is shown a PCB 80 having multiple external terminals or leads 82*a*-82*g*. A mask or a metal layer (e.g., 84*b*, 84*c*, 84*e*, and 84*g*) may be jet-printed to connect the leads to a voltage source 86 and make a unique identifying electrical circuit in the PCB. Some of the metal traces can be connected and some left unconnected using the known printing techniques. The voltage on the external leads can be measured by an electronic circuit (either on or external to the PCB) to identify the board. PCBs usually contain many patterned layers, and only one of them needs to be printed in this way. Therefore, most of the PCB layers can be made by conventional means.

There are other applications of the unique printed identifier circuit on an electronic device in addition to the applications in security described above. These applications include, for example, identifying a specific device or device type and personalizing devices. In the former case, the custom circuit could inform a PC about the type of display or other peripheral device that has been installed. It could be used to keep track of which version of firmware was in used on a specific PBC. In the latter case, a unique printed TFT array could be part of a liquid crystal display (for example the circuit could be placed around the periphery of the main part of the display). This could be patterned to give unique appearance for decoration (e.g. color, pattern), or for information (e.g. status of a cell phone, name of the owner).

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of manufacturing an electronic encryption device with unique encoding, the method comprising:
adding a plurality of partially formed thin film transistors to a substrate, each of the transistors including some of a gate contact, a source contact, a drain contact and a semiconductor;
depositing material via ink jet printing on selected partially formed transistors to form a pattern of partially formed transistors and completed transistors unique to the device; and
providing readout electronics to detect signals from the transistors and create an encoded bit stream, wherein the readout electronics include a charge sensing readout amplifier that detects a high or low amount of charge and the pattern of completed transistors and the partially formed transistors define the encoded bit stream.

2. The method defined in claim 1 wherein the ink jet-printed material is a semiconductor applied between the source and drain contacts.

3. The method defined in claim 1 wherein the partially formed transistors and the completed transistors are arranged in a matrix.

4. The method defined in claim 3 further comprising:
adding a gate line for each row or column in the matrix extending in a first direction;
adding a data line for the other of each row or column extending in a second direction perpendicular to the first direction;
adding a common bias line extending in the first or second direction;
wherein the gate lines are electrically connected to the gate contacts, the data lines are electrically connected to the one of the source or drain contact, and the common bias line is electrically connected to the other of the source or drain contact.

5. The method defined in claim 1 wherein the transistors comprise bottom gate devices.

6. The method defined in claim 1, wherein the readout electronics are integrated next to the transistors.

7. The method defined in claim 4, further comprising:
adding a compensation line comprising a row of thin film transistors without the jet-printed material.

8. The method defined in claim 1 wherein the jet-printed material comprises a masking material such as wax.

9. The method defined in claim 1 wherein the jet-printed material comprises a metal-based ink.

10. A method of manufacturing an electronic encryption device with unique encoding, the method comprising:
adding a plurality of partially formed thin film transistors to a substrate, each of the transistors including some of a gate contact, a source contact, a drain contact and a semiconductor;
depositing material via ink jet printing on selected partially formed transistors to form a pattern of partially formed transistors and completed transistors unique to the device, wherein the partially formed transistors and the completed transistors are arranged in a matrix;
providing readout electronics to detect signals from the transistors and create an encoded bit stream, wherein the pattern of completed transistors and the partially formed transistors define the encoded bit stream;
adding a gate line for each row or column in the matrix extending in a first direction;
adding a data line for the other of each row or column extending in a second direction perpendicular to the first direction;
adding a common bias line extending in the first or second direction; and
wherein the partially formed transistors and the completed transistors are arranged in a matrix, the gate lines are electrically connected to the gate contacts, the data lines are electrically connected to the one of the source or drain contact, and the common bias line is electrically connected to the other of the source or drain contact.

11. The method defined in claim 10, further comprising:
adding a compensation line comprising a row of thin film transistors without the jet-printed material.

12. The method defined in claim 10 wherein the ink jet-printed material comprises a semiconductor applied between the source and drain contacts.

13. The method defined in claim 10 wherein the transistors comprise bottom gate devices.

14. The method defined in claim 10 wherein the readout electronics are integrated next to the transistors and include a sense amplifier to create the encoded bit stream and a discriminator to identify the state of the corresponding bit.

15. The method defined in claim 10 wherein the jet-printed material comprises a masking material such as wax.

16. The method defined in claim 10 wherein the jet-printed material comprises a metal-based ink.

17. A method of manufacturing an electronic encryption device with unique encoding, the method comprising:
adding a plurality of partially formed thin film transistors to a substrate, each of the transistors including some of a gate contact, a source contact, a drain contact and a semiconductor;
depositing material via ink jet printing on selected partially formed transistors to form a pattern of partially formed transistors and completed transistors unique to the device; and
providing readout electronics to detect signals from the transistors and create an encoded bit stream, wherein the readout electronics are integrated next to the transistors and include a sense amplifier to create the encoded bit stream and a discriminator to identify the state of the corresponding bit and the pattern of completed transistors and the partially formed transistors define the encoded bit stream.

18. The method defined in claim 17 wherein the ink jet-printed material comprises a semiconductor applied between the source and drain contacts.

19. The method defined in claim 17 wherein the partially formed transistors and the completed transistors are arranged in a matrix.

20. The method defined in claim 17 wherein the transistors comprise bottom gate devices.

21. The method defined in c 7 wherein the jet-printed material comprises a masking material such as wax.

22. The method defined in claim 17 wherein the jet-printed material comprises a metal-based ink.

23. The method defined in claim 19 further comprising:
adding a gate line for each row or column in the matrix extending in a first direction;
adding a data line for the other of each row or column extending in a second direction perpendicular to the first direction;
adding a common bias line extending in the first or second direction; and
wherein the gate lines are electrically connected to the gate contacts, the data lines are electrically connected to the one of the source or drain contact, and the common bias line is electrically connected to the other of the source or drain contact.

24. The method defined in claim 20 further comprising:
adding a compensation line comprising a row of thin film transistors without the jet-printed material.

* * * * *